United States Patent [19]

Sugiyama et al.

[11] Patent Number: 5,314,603
[45] Date of Patent: May 24, 1994

[54] PLASMA PROCESSING APPARATUS CAPABLE OF DETECTING AND REGULATING ACTUAL RF POWER AT ELECTRODE WITHIN CHAMBER

[75] Inventors: Kazuhiko Sugiyama, Nirasaki; Masafumi Shimizu, Yamanashi; Yukio Naito, Kofu; Eiichi Nishimura; Kouichi Oshima, both of Yamanashi, all of Japan

[73] Assignee: Tokyo Electron Yamanashi Limited, Nirasaki, Japan

[21] Appl. No.: 918,045

[22] Filed: Jul. 24, 1992

[30] Foreign Application Priority Data

Jul. 24, 1991 [JP] Japan .................................. 3-184804

[51] Int. Cl.[5] .................................. C23C 14/34; C23F 1/02
[52] U.S. Cl. .................................. 204/298.32; 204/192.33; 156/345
[58] Field of Search .................. 156/345; 204/298.03, 204/298.08, 298.32, 298.34, 192.33, 298.39

[56] References Cited

U.S. PATENT DOCUMENTS

| | | | |
|---|---|---|---|
| 4,500,408 | 2/1985 | Boys et al. | 204/298.03 |
| 4,626,312 | 12/1986 | Tracy | 204/298.34 X |
| 4,871,421 | 10/1989 | Ogle et al. | 156/643 |
| 5,116,482 | 5/1992 | Setoyama et al. | 204/298.34 X |

FOREIGN PATENT DOCUMENTS

59-73900   4/1984   Japan .
63-258110  10/1988  Japan .

Primary Examiner—Nam Nguyen
Attorney, Agent, or Firm—Oblon, Spivak, McClelland, Maier & Neustadt

[57] ABSTRACT

A plasma processing apparatus has a process chamber and a pair of electrodes provided in the process chamber to oppose each other. An RF power supply outputs an RF power to be supplied to at least one of the pair of electrodes in the process chamber. A power detector detects an actual RF power to be applied to one of the electrodes in the process chamber. A controller controls the RF power output from the RF power supply to a predetermined value in accordance with the actual RF power detected by the power detector.

21 Claims, 5 Drawing Sheets

PLASMA PROCESSING APPARATUS CAPABLE OF DETECTING AND REGULATING ACTUAL RF POWER AT ELECTRODE WITHIN CHAMBER

BACKGROUND OF THE INVENTION

Field of the Invention

The present invention generally relates to a plasma processing apparatus and, more particularly, to a plasma processing apparatus, e.g., a plasma etching apparatus, for detecting an actual high-frequency (RF) power applied to an electrode in a process chamber and regulating the RF power to a predetermined value.

Description of the Related Art

In the semiconductor device manufacturing process, a plasma etching apparatus which performs etching in accordance with so-called dry etching is conventionally utilized to form a fine circuit pattern or the like of a semiconductor device. In such a plasma etching apparatus, for example, upper and lower electrodes opposing in the vertical direction are provided in a process chamber. A predetermined etching gas is supplied into the process chamber. An RF power is supplied across the upper and lower electrodes from an RF power supply to activate the etching gas (to generate a gas plasma). The etching gas plasma is caused to act on a semiconductor wafer placed on, e.g., the lower electrode to perform etching.

In the plasma processing apparatus of this type, the value of the RF power applied to the electrode in the process chamber serves as an important factor in stabilizing the plasma generated in the process chamber.

For example, U.S. Pat. No. 4,871,421 discloses a plasma etching apparatus having a structure as follows. Both terminals of a secondary coil of a transformer in which both terminals of a primary coil are connected to an RF power supply and a center tap of the secondary coil is grounded, are connected to upper and lower electrodes in a process camber. An RF power from the RF power supply is distributed by the transformer into powers at a ratio of 50:50 which have phases different from each other by 180°, and these different powers are supplied to the upper and lower electrodes. In this plasma etching apparatus, the potential difference between the upper and lower electrodes can be set larger than the potential difference between these electrodes and a process chamber side wall. Thus, undesired abnormal discharge caused by the electrons in the plasma flying toward the chamber side wall can be prevented, and a stable plasma can be generated even in a low-pressure plasma process which has been demanded often recently.

According to the intensive studies made by the present inventors, however, in the conventional plasma etching apparatus described above, the actual power to be supplied to each electrode sometimes varies due to a change in electric characteristic at the respective members caused by, e.g., a temperature change, and the power set by the RF power supply and the power to be actually supplied to each electrode differ to impair stability of the plasma to be generated. As a result, precision of etching is degraded.

Figure 6:
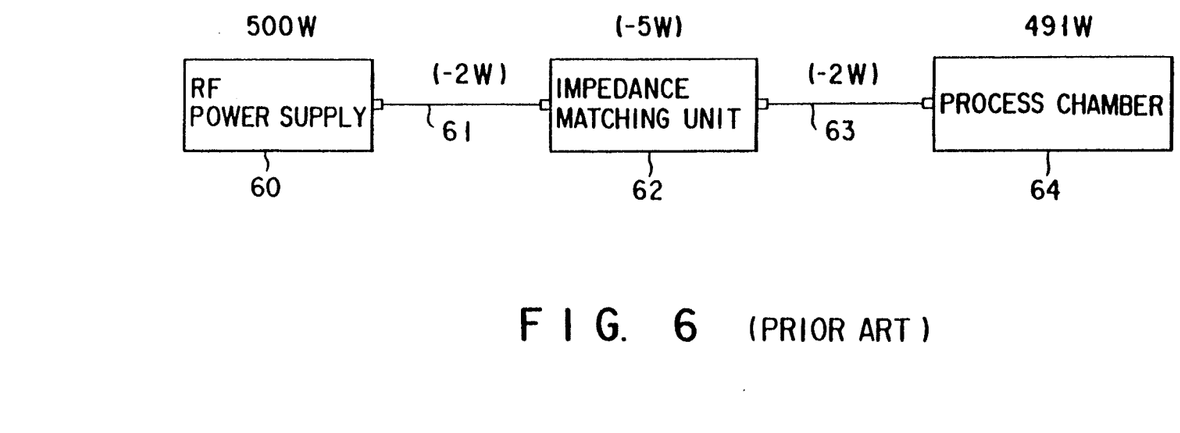
FIG. 6 is a block diagram for explaining drawbacks of a conventional plasma processing apparatus.

Furthermore, according to the intensive studies made by the present inventors, even if an output power from the RF power supply is constant, the power loss due to consumption on the path to the chamber differs from one apparatus to another, and the actual RF power to be supplied to the electrode in the chamber is not necessary constant. More specifically, usually, an RF power is applied along a path in an order of an RF power supply 60 → a first cable 61 → an impedance matching unit 62 → a second cable 63 → an electrode 64 in the process chamber, as shown in FIG. 6. Even if the RF power is output from the RF power supply 60 at, e.g., 500 W, since the power losses in the first and second cables 61 and 63 are respectively about 2 W and the power loss in the impedance matching unit 62 is about 5 W, the RF power to be actually applied to the electrode in the chamber is about 491 W. That is, a power loss of about 10 W occurs along the path from the RF power supply to the chamber, and this value varies depending on the cable length or environmental conditions.

This implies that, assuming a plurality of plasma etching apparatuses, the actual RF powers to be supplied to the electrodes in the respective chambers differ from each other, and stabilization in plasma differs among the respective apparatuses, leading to a variation in etching precision that can be caused easily.

SUMMARY OF THE INVENTION

It is, therefore, an object of the present invention to provide a new and improved plasma processing apparatus in which an RF power to be actually applied to an electrode in a process chamber can be detected and regulated to a predetermined value to stabilize plasma generation, thereby improving precision of plasma processing.

According to a first aspect of the present invention, there is provided a plasma processing apparatus comprising:

plasma processing means having a process chamber and a pair of electrodes arranged in the process chamber to oppose each other;

an RF power supply for outputting an RF power to be applied to at least one of the pair of electrodes in the process chamber;

power detection means for detecting an actual RF power to be applied to one of the pair of electrodes in the process chamber; and control means for controlling the RF power output from the RF power supply to a predetermined value in accordance with the actual RF power detected by the power detection means.

According to a second aspect of the present invention, there is provided a plasma processing apparatus comprising:

plasma processing means having a process chamber and first and second electrodes arranged in the process chamber to oppose each other;

a first RF power supply for outputting a first RF power to be applied to the first electrode in the process chamber;

a second RF power supply for outputting a second RF power to be applied to the second electrode in the process chamber;

first power detection means for detecting an actual first RF power to be applied to the first electrode in the process chamber;

second power detection means for detecting an actual second RF power to be applied to the second electrode in the process chamber; and control mean for controlling the first and second RF powers output from the first and second RF power supplies to predetermined values in accordance with the actual first and second RF powers detected by the first and second power detection means, wherein the first and second RF power output from the first and second RF power supplies have a predetermined phase difference therebetween.

According to a third aspect of the present invention, there is provided a plasma processing apparatus comprising:

plasma processing means having a process chamber and first and second electrodes arranged in the process chamber to oppose each other;

an RF power supply for outputting a predetermined RF power;

power dividing means for dividing the predetermined RF power supplied from the RF power supply into first and second RF powers having a predetermined phase difference therebetween and applying the first and second RF powers to the first and second electrodes in the process chamber;

first power detection means for detecting an actual first RF power to be applied to the first electrode in the process chamber;

second power detection means for detecting an actual second RF power to be applied to the second electrode in the process chamber; and control means for controlling the predetermined RF power output from the RF power supply to a predetermined value in accordance with the actual first and second RF powers detected by the first and second power detection means, thereby controlling the first and second RF powers to be actually applied on the first and second electrodes to predetermined values.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Reference will now be made in detail to the presently preferred embodiments of the invention as illustrated in the accompanying drawings, in which like reference characters designate like or corresponding parts throughout the several drawings.

The basic structure of the plasma processing apparatus according to the present invention in which the first embodiment is applied to a plasma etching apparatus will be described with reference to FIG. 1.

Figure 1:
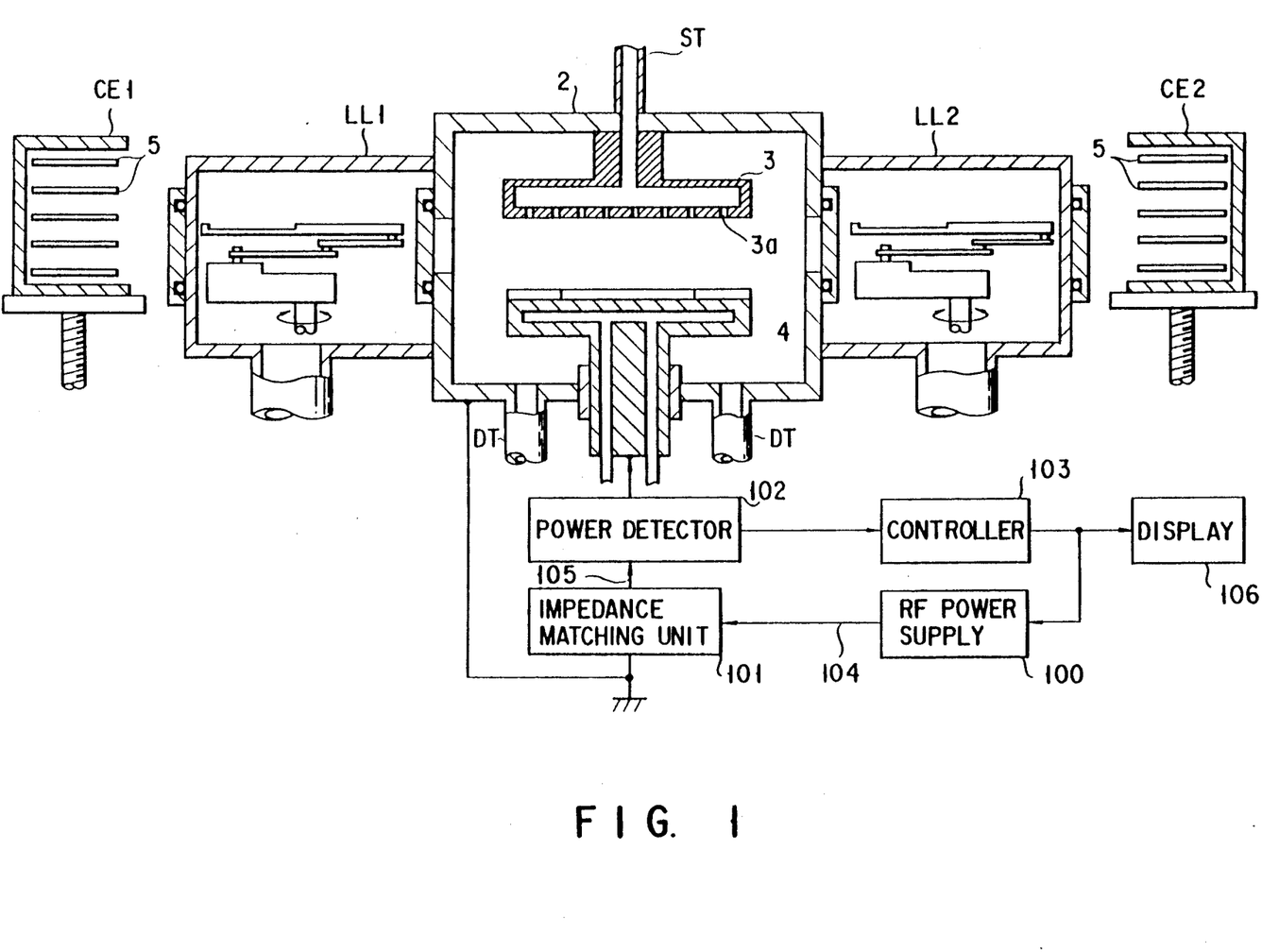
FIG. 1 is a view showing a plasma processing apparatus according to the first embodiment of the present invention.

As shown in FIG. 1, the plasma etching apparatus has a process chamber 2 made of a metal material, e.g., anodized aluminum and having an interior that can be hermetically closed. The process chamber 2 is electrically grounded, and upper and lower electrodes 3 and 4 constituting a pair of parallel plate electrodes are provided in the process chamber 2. One of the upper and lower electrodes 3 and 4 is electrically connected to the inner wall of the process chamber 2, and the other of them is electrically insulated from the inner wall of the process chamber 2.

The lower electrode 4 can place a semiconductor wafer 5 as an object to be processed on its upper surface. The upper electrode 3 can supply, through a multiple of pores 3a therein, a predetermined etching gas, supplied through a supply tube ST, toward the semiconductor wafer 5 placed on the lower electrode 4.

The semiconductor wafer 5 can be loaded from a cassette elevator CE1 storing non processed wafers 5 to the chamber 2 through a loading load lock mechanism LL1 and placed on the lower electrode 4 in the chamber 2.

Note that a processed wafer 5 can be unloaded from the chamber 2 to a cassette elevator CE2 for storing the processed semiconductor wafers 5 through an unloading load-lock mechanism LL2.

An RF power supply 100 can apply an RF power having a predetermined frequency to an impedance matching unit 101 through a first cable 104 and then to the lower electrode 4 through a second cable 105. A power detector 102 is arranged in the terminal portion of the second cable 105, i.e., in the vicinity of the lower electrode 4 in the chamber 2.

As is known, the impedance matching unit 101 is necessary for efficiently applying the RF power from the RF power supply 100 to the lower electrode 4 in the process chamber 2. For example, an "automatic impedance matching unit for a plasma power supply" disclosed in Published Unexamined Japanese Patent Application No. 59-73900 or an "impedance matching unit for an RF plasma power supply" disclosed in Published Unexamined Japanese Patent Application No. 63-258110 can be used as the impedance matching unit 101. This applies to the second and third embodiments to be described later.

The power detector 102, which will be described later in detail, can detect an actual RF power applied to the lower electrode 4 in the chamber 2. The detected RF power is displayed on a display 106 through a controller 103 incorporating a CPU and peripheral circuits, and the output power from the RF power supply 100 can be regulated through the controller 103 in the feedback manner in accordance with the detection output.

Reference symbol DT in FIG. 1 denotes a discharge tube for evacuating and discharging in the process chamber 2.

In the plasma etching apparatus of the first embodiment having the arrangement described above, the semiconductor wafer 5 is loaded into the process chamber 2 from the load-lock mechanism LL1 and placed on the lower electrode 4. While the process chamber 2 is kept evacuated through the discharge tube DT at a predetermined vacuum degree (e.g., 100 mTorr), a predetermined etching gas (e.g., $CHF_3$) is supplied to the chamber 2 toward the semiconductor wafer 5 through the large number of pores 3a in the upper electrode 3, and an RF power having a predetermined frequency, e.g., 13.56 MHz or 380 kHz is supplied from the RF power supply 100 to the lower electrode 4 through the impedance matching unit 101. Then, the etching gas is converted to a gas plasma by the RF power, and the semiconductor wafer 5 is etched by the plasma.

In the plasma etching apparatus of this embodiment, the RF power to be actually applied to the lower electrode 4 in the chamber 2 is detected by the power detector 102, as described above, and the controller 103 performs feedback control in accordance with the detection value such that the output power from the RF power supply 100 has a predetermined value.

Figure 2:
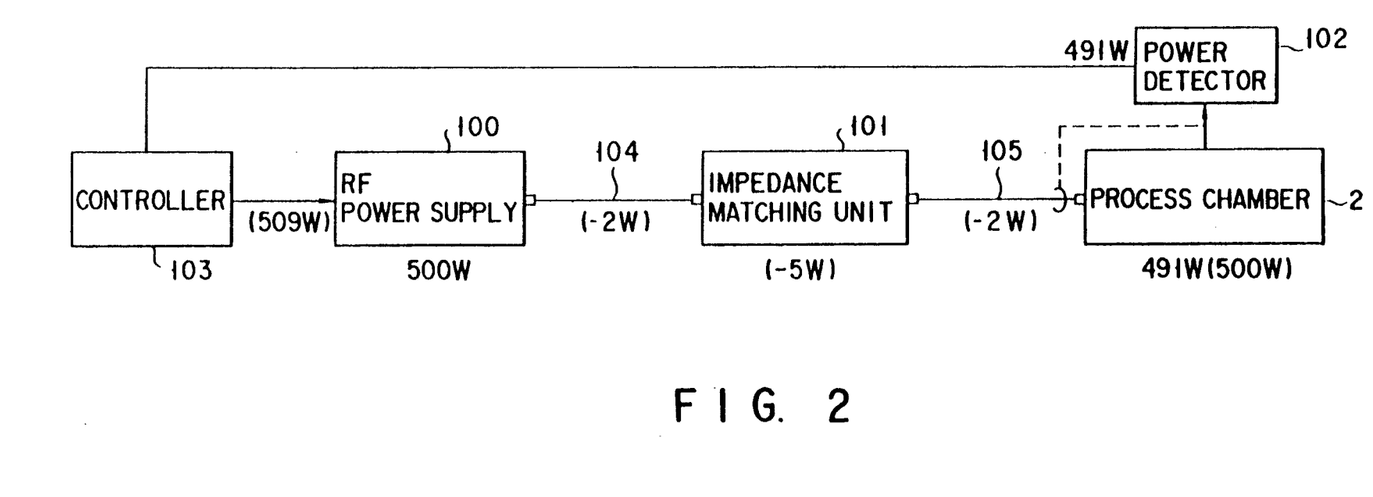
FIG. 2 is a block diagram for explaining the feedback control scheme of the apparatus shown in FIG. 1.

FIG. 2 shows this feedback control. Assume that, e.g., an initial RF power of 500 W is output from the RF power supply 100, and that the power losses in the first and second cables 104 and 105 are 2 W, respectively, and the power loss in the impedance matching unit 101 is 5 W. Then, an RF power of 491 W is applied to the lower electrode 4 in the process chamber 2.

Since the power detector 102 detects that the RF power actually applied to the lower electrode 4 in the process chamber 2 is 491 W, the controller 103 to which this detection output is fed back outputs a control command to the RF power supply 100 to output an RF power of 509 W obtained by adding 9 W to the initial 500 W in order to compensate for the power loss in the path up to the chamber 2.

As a result, an RF power of 500 W necessary for stable plasma generation is constantly applied to the lower electrode 4 in the process chamber 2. This feedback control is performed in accordance with changes in cable length or variations in environmental conditions. Accordingly, when compared to the conventional plasma etching apparatus that does not perform feedback control, the plasma etching apparatus of this embodiment can always maintain high etching precision since an unstable factor in plasma generation due to the variation in RF power is removed.

In addition, even if a plurality of plasma etching apparatuses are to be assumed, according to this embodiment, they are controlled to have high etching precision on the basis of the actual RF powers applied to the electrodes in the respective chambers. Therefore, according to the present invention, unlike in the conventional case, a difference in plasma stabilization does not occur among the apparatuses. As a result, all the apparatuses according to present invention can achieve the uniform etching precision without causing variations in etching precision of the respective apparatuses.

The second embodiment of the present invention will be described with reference to the accompanying drawings.

Figure 3:
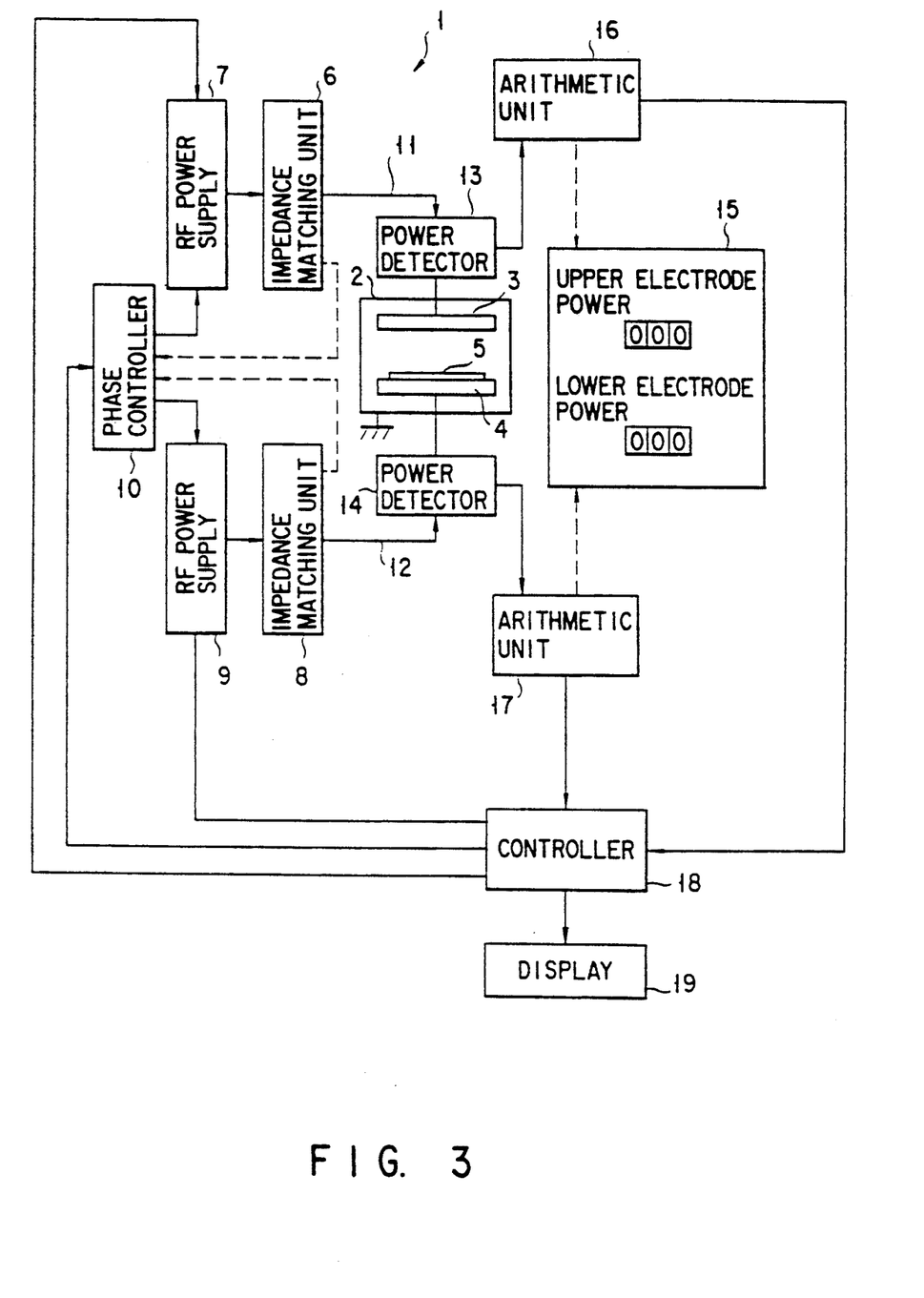
FIG. 3 is a view showing a plasma processing apparatus according to the second embodiment of the present invention.

As shown in FIG. 3, an etching apparatus 1 has a process chamber 2 made of a metal material, e.g., anodized aluminum and having an interior that can be hermetically closed. The process chamber 2 is electrically grounded, and upper and lower electrodes 3 and 4 constituting a pair of parallel plate electrodes electrically insulated from the inner wall of the process chamber 2 are provided in the process chamber 2.

The lower electrode 4 can place a semiconductor wafer 5 as an object to be processed on its upper surface. The upper electrode 3 can supply, through, e.g., a multiple of pores (not shown) therein, a predetermined etching gas toward the semiconductor wafer 5 placed on the lower electrode 4.

The upper electrode 3 described above is connected to an RF power supply 7 through an impedance matching unit 6. The lower electrode 4 is connected to an RF power supply 9 through an impedance matching unit 8. The RF power supplies 7 and 9 are provided with phase locked loops (PLLs), for example, and connected to a phase controller 10 having a transmitter, respectively. While the phase controller 10 monitors the phases of the outputs from the impedance matching units 6 and 8, the phases of the respective RF powers output from the RF power supplies 7 and 9 can be arbitrarily set and controlled within a predetermined range, e.g., a range of ±180°.

Figure 4:
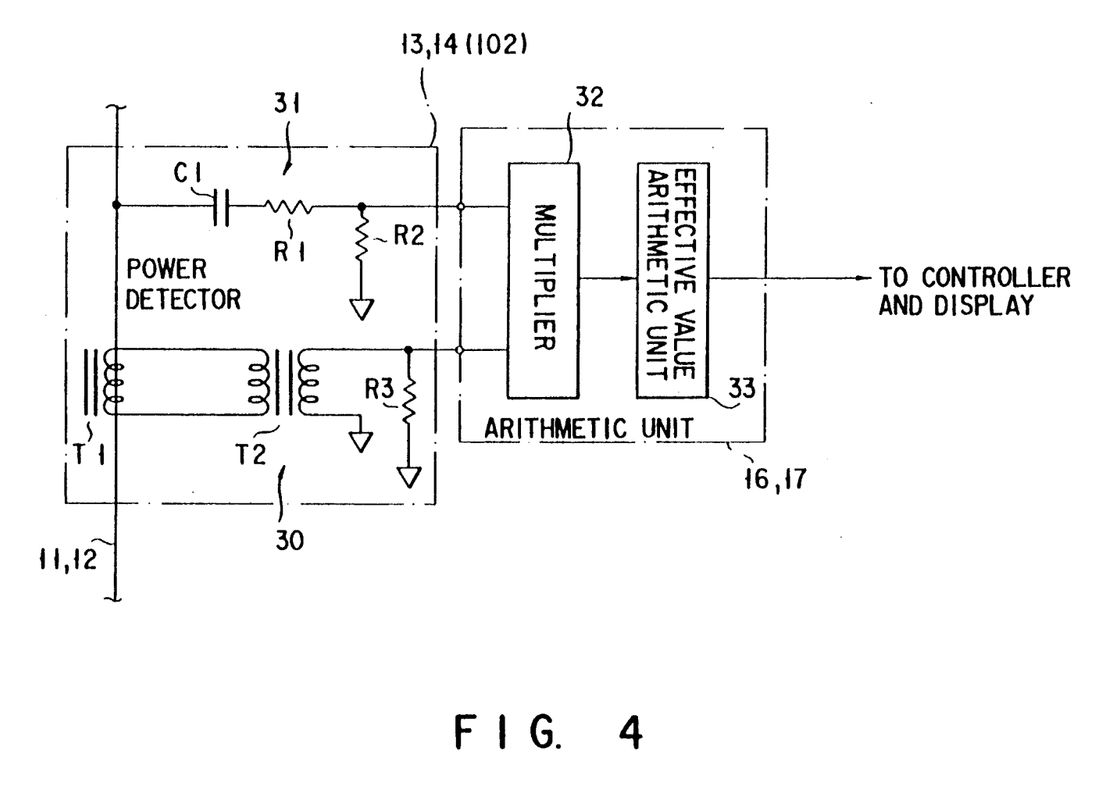
FIG. 4 is a block diagram showing detailed arrangements of a power detector and an arithmetic unit shown in FIG. 3.

An RF cable 11 is connected to the impedance matching unit 6 and the upper electrode 3, and the RF cable 12 is connected to the impedance matching unit 8 and the lower electrode 4. Power detectors 13 and 14 are connected to terminal portions of the RF cables 11 and 12, respectively. Each of the power detectors 13 and 14 comprises a current detector 30 and a voltage detector 31, as shown in FIG. 4. Each of arithmetic units 16 and 17 for calculating outputs from the power detectors 13 and 14, respectively, comprises a multiplier 32 for multiplying a detection output from the corresponding current detector 30 by a detection output from a voltage detector 31, and an effective value arithmetic unit 33 for calculating an effective value from the product obtained by the multiplier 32 at a predetermined timing (e.g., every 100 msec.) and outputting the effective value.

Each current detector 30 includes a current transformer T1 coupled to the RF cable 11 or 12, a transformer T2 coupled to the current transformer T1, and a resistor R3 connected between one terminal of the secondary winding of the transformer T2 and the ground terminal to obtain an output component corresponding to the RF current flowing across the resistor R3 to the RF cable 11 or 12.

Each voltage detector 31 includes a capacitor C1 connected in series between the RF cable 11 or 12 and the ground terminal, and resistors R1 and R2 to obtain an output component corresponding to the RF voltage applied to the RF cables 11 or 12 from a connecting point between the resistors R1 and R2.

Outputs from the effective value arithmetic units 33 of the arithmetic units 16 and 17 are input to a display 15 incorporating an A/D converter and displayed as actual powers supplied to the upper and lower electrodes 3 and 4 in the digital manner. The display 15 may be also displayed the current or voltage calculated by the arithmetic units 16 and 17, or the ratio in power of the upper electrode 3 to the lower electrode 4.

The power detector 102 used in the first embodiment can employ the power detector 13 or 14 shown in FIG. 4. Note that in the first embodiment a portion corresponding to the arithmetic unit 16 or 17 in FIG. 4 is included in the controller 103.

Referring back to FIG. 3, the outputs from the arithmetic units 16 and 17 ar fed back to the phase controller 10 and the RF power supplies 7 and 9 through the controller 18 including a CPU and peripheral circuits.

The controller 18 is connected to a display 19 for performing desired display including display similar to that of the display 15.

In the plasma etching apparatus 1 of the second embodiment having the arrangement described above, the semiconductor wafer 5 is loaded into the process chamber 2 through a loading/unloading port (not shown) and placed on the lower electrode 4. While the process chamber 2 is kept evacuated at a predetermined vacuum degree (e.g., 100 mTorr), a predetermined etching gas (e.g., $CHF_3$) is supplied in the chamber 2 toward the semiconductor wafer 5 through a multiple of pores (not shown) in the upper electrode 3, and an RF power having a predetermined frequency, e.g., 13.56 MHz or 380 KHz is supplied from the RF power supplies 7 and 9 to the lower electrode 4 through the impedance matching units 6 and 8. Then, the etching gas is converted to a gas plasma by the RF power, and the semiconductor wafer 5 is etched by the plasma.

In the second embodiment, RF powers having a predetermined phase difference between them are separately applied from the two RF power supplies 7 and 9 to the upper and lower electrodes 3 and 4 in the process chamber 2 through the impedance matching units 6 and 8, respectively. These actually applied RF powers are separately detected by the power detectors 13 and 14 and calculated as the effective powers by the arithmetic units 16 and 17. The calculated effective powers are fed back to the two RF power supplies 7 and 9 through the controller 18 to control the respective RF powers so that the powers therefrom are set to predetermined values. The method and effect of the feedback control are the same as those described above in the first embodiment.

At this time, the controller 18 controls the phases of the respective RF powers output from the RF power supplies 7 and 9 to be phase-shifted by, e.g., 180° from each other. The controller 18 can also set the ratio in RF power of the upper electrode 3 to the lower electrode 4 to, e.g., 50:50, 90:10, or 80:20 by changing the output setting of the RF power supplies 7 and 9. Since the two RF power supplies 7 and 9 are used in this embodiment, the ratio in RF power of the upper electrode 3 to the lower electrode 4 can be continuously set to an arbitrary value. This control can also be performed in the software manner by the CPU incorporated in the controller 18, and the ratio in RF power of the upper electrode 3 to the lower electrode 4 can be changed during the etching process.

The powers actually supplied to the upper and lower electrodes 3 and 4 are measured by the power detectors 13 and 14, and effective powers calculated by the arithmetic units 16 and 17 are displayed on the display 15 in the digital manner. Hence, since the RF power supplies 7 and 9 are feedback-controlled through the controller 18, the operator can monitor whether the powers actually supplied to the upper and lower electrodes 3 and 4 are kept at the predetermined values from the digital display on the display 19. Thus, the operator can immediately cope with an unexpected RF power variation, and etching with higher precision than in the conventional apparatus can be performed.

Figure 5:
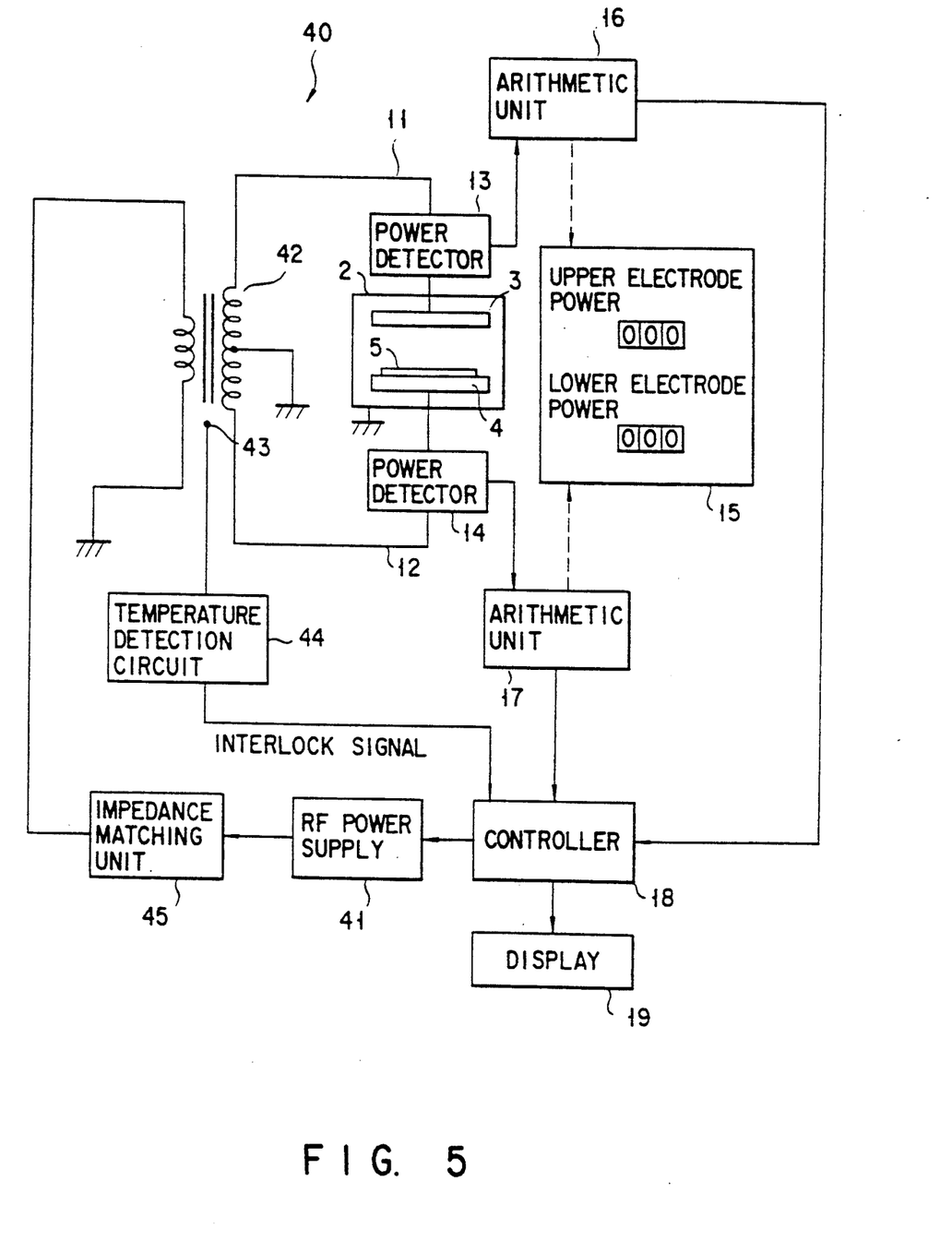
FIG. 5 is a view showing a plasma processing apparatus according to the third embodiment of the present invention.

FIG. 5 shows an arrangement of a plasma etching apparatus 40 according to the third embodiment of the present invention. In FIG. 5, the same portions as in the etching apparatus of the second embodiment shown in FIG. 3 are denoted by the same reference numerals, and a repetitive description thereof will be omitted.

In the etching apparatus 40, an RF power from a single RF power supply 41 is distributed by a transformer 42 through an impedance matching unit 45 so that RF powers having phases different from each other by 180° are supplied to upper and lower electrodes 3 and 4. Also, a temperature sensor 43 for detecting a temperature of the transformer 42 and a temperature detection circuit 44 are provided in this embodiment. When the temperature of the transformer 42 is increased to almost burn it, an interlock signal is generated by the temperature detection circuit 44 to stop power supply from the RF power supply 41 through a controller 18. The interlock signal is generated when the temperature of the transformer 42 is increased to, e.g., 80° C. or more.

In the etching apparatus 40 as described above, the permeability of the core member of the transformer 42 is decreased by, e.g., a temperature increase to degrade the efficiency of the transformer 42, thus disabling predetermined power transmission. Even in this case, the powers actually supplied to the upper and lower electrodes 3 and 4 are measured by power detectors 13 and 14, and effective powers calculated by arithmetic units 16 and 17 are displayed on a display 15 in the digital manner. Hence, since the RF power supply 41 is feedback controlled through the controller 18, the operator can monitor whether the powers actually supplied to the upper and lower electrodes 3 and 4 are kept at the predetermined values from the digital display on the display 19. Thus, the operator can immediately cope with an unexpected RF power variation, and etching with higher precision than in the conventional apparatus can be performed. Furthermore, burning of the transformer 42 caused by a temperature increase can be prevented to improve the safety when compared to the conventional apparatus.

As has been described above, according to the plasma process apparatus of the present invention, the RF powers actually supplied to the respective electrodes in the process chamber can be controlled to contribute to stabilization of plasma generation, and plasma processing with higher precision than in the conventional apparatus can be performed. Simultaneously, a process free from a difference among apparatuses can be easily established.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A plasma processing apparatus, comprising:
   plasma processing means including a processing chamber and upper and lower electrodes which are located in the processing chamber and which face each other;
   an RF power source, located away from the plasma processing means by a predetermined distance, for outputting RF power and applying the RF power to the lower electrode located in the processing chamber through a cable transmission line of a predetermined length;

impedance matching means, inserted at an intermediate point of the cable transmission line, for impedance matching;

power detecting means, provided at that end of the cable transmission line which is located in the vicinity of the plasma processing means, for detecting a value of the RF power actually applied to the lower electrode, said power detecting means including:

(a) a current detector comprising a current transformer coupled to the end of the cable transmission line that is located in the vicinity of the plasma processing means, a voltage transformer coupled to the current transformer, and a resistor connected to the voltage transformer, said current detector detecting a current component of the RF power actually applied to the lower electrode by means of the resistor;

(b) a voltage detector comprising a capacitor having a first end coupled to the end of the cable transmission line that is located in the vicinity of the plasma processing chamber and a resistor circuit coupled to a second end of the capacitor, said voltage detector detecting a voltage component of the RF power actually applied to the lower electrode by means of the resistor circuit; and (c) an operation section for multiplying the current component detected by the current detector by the voltage component detected by the voltage detector, for extracting an effective value component of the RF power actually applied to the lower electrode from results of multiplication, and for outputting the effective value component at predetermined intervals; and control means for controlling the RF power output from the RF power source so that the RF power output has a desirable value in accordance with the effective value component extracted from the operation section of the power detecting means, whereby the RF power output is compensated for power loss occurring at least in the cable transmission line and the impedance matching means.

2. A plasma processing apparatus according to claim 1, further comprising display means for displaying the effective value component output from the operation section of the power detecting means.

3. A plasma processing apparatus according to claim 1, wherein said operation section outputs an effective value of the RF power at intervals of 100 milliseconds.

4. A plasma processing apparatus, comprising:

plasma processing means including a processing chamber and upper and lower electrodes which are located in the processing chamber and which face each other;

an RF power source, located away from the plasma processing means by a predetermined distance, for outputting RF power and applying the RF power to the lower electrode located in the processing chamber through a cable transmission line of a predetermined length;

impedance matching means, inserted at an intermediate point of the cable transmission line, for impedance matching;

power detecting means, provided at that end of the cable transmission line which is located in the vicinity of the plasma processing means, for detecting a value of the RF power actually applied to the lower electrode, said power detecting means including:

(a) a current detector comprising a current transformer coupled to the end of the cable transmission line that is located in the vicinity of the plasma processing means, a voltage transformer coupled to the current transformer, and a resistor connected to the voltage transformer, said current detector detecting a current component of the RF power actually applied to the lower electrode by means of the resistor;

(b) a voltage detector comprising a capacitor having a first end coupled to the end of the cable transmission line that is in the vicinity of the plasma processing means, and a resistor circuit coupled to a second end of the capacitor, said voltage detector detecting a voltage component of the RF power actually applied to the lower electrode by means of the resistor circuit; and (c) an operation section for multiplying the current component detected by the current detector by the voltage component detected by the voltage detector, for extracting an effective value component of the RF power actually applied to the lower electrode from results of multiplication, and for outputting the effective value component at predetermined intervals;

power control means for controlling the RF power output from the RF power source so that the RF power output has a desirable value in accordance with the effective value component extracted from the operation section of the power detecting means, whereby the RF power output is compensated for power loss occurring at least in the cable transmission line and the impedance matching means; and phase control means for monitoring a phase of the RF power passing through the impedance matching means and for controlling a phase of the RF power output from the RF power source to have a value falling within a desirable range.

5. A plasma processing apparatus according to claim 4, further comprising display means for displaying the effective value component output from the operation section of the power detecting means.

6. A plasma processing apparatus according to claim 4, wherein said operation section outputs an effective value of the RF power at intervals of 100 milliseconds.

7. A plasma processing apparatus according to claim 4, wherein said phase control means controls the phase of the RF power output from the RF power source to have a value falling with a range of ±180°.

8. A plasma processing apparatus, comprising:

plasma processing means including a processing chamber and upper and lower electrodes which are located in the processing chamber and which face each other;

an RF power source, located away from the plasma processing means by a predetermined distance, for outputting RF power and applying the RF power to the lower electrode located in the processing chamber through a cable transmission line of a predetermined length;

impedance matching means, inserted at an intermediate point of the cable transmission line, for impedance matching;

power detecting means, provided at that end of the cable transmission line which is located in the vicinity of the plasma processing means, for detecting a value of the RF power actually applied to the lower electrode, said power detecting means including:

(a) a current detector comprising a current transformer coupled to the end of the cable transmission line that is located in the vicinity of the plasma processing means and a resistor connected to the voltage transformer, said current detector detecting a current component of the RF power actually applied to the upper electrode by means of the resistor;

(b) a voltage detector comprising a capacitor having a first end coupled to the end of the cable transmission line that is in the vicinity of the plasma processing means, and a resistor circuit coupled to a second end of the capacitor, said voltage detector detecting a voltage component of the RF power actually applied to the lower electrode by means of the resistor circuit; and (c) an operation section for multiplying the current component detected by the current detector by the voltage component detected by the voltage detector, for extracting an effective value component of the RF power actually applied to the upper electrode from results of multiplication, and for outputting the effective value component at predetermined timings; and control means for controlling the RF power output from the RF power source so that the RF power output has a desirable value in accordance with the effective value component extracted from the operation section of the power detecting means whereby the RF power output compensated for power loss least in the cable transmission line and the impedance matching means.

9. A plasma processing apparatus according to claim 8, further comprising display means for displaying the effective value component output from the operation section of the power detecting means.

10. A plasma processing apparatus according to claim 8, wherein said operation section outputs an effective value of the RF power at intervals of 100 milliseconds.

11. A plasma processing apparatus, comprising:

plasma processing means including a processing chamber and upper and lower electrodes which are located in the processing chamber and which face each other;

an RF power source, located away from the plasma processing means by a predetermined distance, for outputting RF power and applying the RF power to the lower electrode located in the processing chamber through a cable transmission line of a predetermined length;

impedance matching means, inserted at an intermediate point of the cable transmission line, for impedance matching;

power detecting means, provided at that end of the cable transmission line which is located in the vicinity of the plasma processing means, for detecting a value of the RF power actually applied to the lower electrode, said power detecting means including:

(a) a current detector comprising a current transformer coupled to the end of the cable transmission line that is located in the vicinity of the plasma processing means, a voltage transformer coupled to the current transformer, and a resistor connected to the voltage transformer, said current detector detecting a current component of the RF power actually applied to the lower electrode by means of the resistor;

(b) a voltage detector comprising a capacitor having a first end coupled to the end of the cable transmission line that is in the vicinity of the plasma and a resistor circuit coupled to a second end of the capacitor, said voltage detector detecting a voltage component of the RF power actually applied to the upper electrode by means of the resistor circuit; and (c) an operation section for multiplying the current component detected by the current detector by the voltage component detected by the voltage detector, for extracting an effective value component of the RF power actually applied to the upper electrode from results of multiplication, and for outputting the effective value component at predetermined intervals;

power control means for controlling the RF power output from the RF power source so that the RF power output has a desirable value in accordance with the effective value component extracted from the operation section of the power detecting means, whereby the RF power output is compensated for power loss at least in the cable transmission line and the impedance matching means; and phase control means for monitoring a phase of the RF power passing through the impedance matching means and for controlling a phase of the RF power output from the RF power source to have a value falling within a desirable range.

12. A plasma processing apparatus according to claim 11, further comprising display means for displaying the effective value component output from the operation section of the power detecting means.

13. A plasma processing apparatus according to claim 11, wherein said operation section outputs an effective value of the RF power at intervals of 100 milliseconds.

14. A plasma processing apparatus according to claim 11, wherein said phase control means controls the phase of the RF power output from the RF power source to have a phase value falling with a range of $\pm 180°$.

15. A plasma processing apparatus, comprising:

plasma processing means including a processing chamber and upper and lower electrodes which are located in the processing chamber and which face each other;

RF power supply means located away from the plasma processing means by a predetermined distance, said RF power supply means including:

(a) an RF power source for outputting predetermined RF power;

(b) power dividing means for dividing the RF power output from the RF power source into a first RF power and a second RF power which differ from each other by a predetermined phase, and for applying the first RF power and the second RF power to the lower and upper electrodes through first and second cable transmission lines, respectively; and (c) impedance matching means for performing impedance matching with respect to the first and second cable transmission lines;

first and second power detecting means, respectively provided at those ends of the first and second cable transmission lines which are located in the vicinity of the plasma processing means, for detecting values of the first RF power and the second RF power that are actually applied to the lower and upper electrodes, respectively, each of said first and second power detecting means including:

(a) a current detector comprising a current transformer coupled to the end of the corresponding one of the cable transmission lines that is in the vicinity of the plasma processing means, a voltage transformer coupled to the current transformer, and a resistor connected to the voltage transformer, said current detector detecting a current component of the RF power actually applied to a corresponding one of the upper and lower electrodes by means of the resistor;

(b) a voltage detector comprising a capacitor having a first end coupled to the end of said corresponding one of the cable transmission lines that is in the vicinity of the plasma processing chamber and a resistor circuit coupled to a second end of the capacitor, said voltage detector detecting a voltage component of the RF power actually applied to said corresponding one of the upper and lower electrodes by means of the resistor circuit; and (c) an operation section for multiplying the current component detected by the current detector by the voltage component detected by the voltage detector, for extracting an effective value component of the RF power actually applied to said corresponding one of the upper and lower electrodes from results of multiplication, and for outputting the effective value component at predetermined intervals; and control means for controlling the RF power output from the RF power source so that the RF power output has a desirable value in accordance with the effective value components from the operation sections of the first and second power detecting means, whereby the RF power output is compensated for power loss occurring at least in the first and second cable transmission lines and the impedance matching means.

16. A plasma processing apparatus according to claim 15, further comprising display means for displaying the effective value components output from the operation sections of the first and second power detecting means.

17. A plasma processing apparatus according to claim 15, wherein said power dividing means includes a transformer having first and second windings, said first winding is applied with the predetermined RF power output from the RF power source, said second winding has a grounded intermediate point, and said first RF power and said second RF power, which differ in phase by 180°, are derived from two ends of the second winding.

18. A plasma processing apparatus according to claim 17, further comprising:

a temperature sensor for sensing the temperature of the transformer; and temperature detecting means for controlling the RF power applied to the transformer in a predetermined state in accordance with an output of the temperature sensor.

19. A plasma processing apparatus according to claim 18, wherein said temperature detecting means includes application stopping means for causing the control means to prevent the predetermined RF power from being applied to the transformer, when the output of the temperature sensor exceeds a predetermined value.

20. A plasma processing apparatus according to claim 19, wherein said application stopping means outputs an interlock signal for stopping application of the RF power.

21. A plasma processing apparatus according to claim 19, wherein said application stopping means starts operating when the output of the temperature sensor takes a value corresponding to about 80° C.

* * * * *